(12) United States Patent
Takei et al.

(10) Patent No.: US 11,149,342 B2
(45) Date of Patent: Oct. 19, 2021

(54) SPUTTERING APPARATUS

(71) Applicant: Tokyo Electron Limited, Tokyo (JP)

(72) Inventors: Junichi Takei, Yamanashi (JP); Hiroshi Sone, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/783,282

(22) Filed: Feb. 6, 2020

(65) Prior Publication Data

US 2020/0255935 A1  Aug. 13, 2020

(30) Foreign Application Priority Data

Feb. 12, 2019  (JP) .............................. JP2019-022969

(51) Int. Cl.
*C23C 14/34* (2006.01)
*H01J 37/34* (2006.01)
*H01J 37/32* (2006.01)

(52) U.S. Cl.
CPC ...... *C23C 14/3407* (2013.01); *C23C 14/3471* (2013.01); *H01J 37/32449* (2013.01); *H01J 37/32651* (2013.01); *H01J 37/3414* (2013.01); *H01J 37/3452* (2013.01)

(58) Field of Classification Search
None
See application file for complete search history.

(56) References Cited

U.S. PATENT DOCUMENTS

| 4,472,259 | A | * | 9/1984 | Class | H01J 37/3405 |
|---|---|---|---|---|---|
| | | | | | 204/192.12 |
| 5,134,965 | A | * | 8/1992 | Tokuda | H01J 37/32247 |
| | | | | | 118/723 MW |
| 2004/0094411 | A1 | * | 5/2004 | Chistyakov | H01J 37/3408 |
| | | | | | 204/298.07 |
| 2013/0256128 | A1 | * | 10/2013 | Ritchie | H01J 37/32495 |
| | | | | | 204/298.11 |

FOREIGN PATENT DOCUMENTS

| JP | 2006-505906 A | 2/2006 |
|---|---|---|
| KR | 10-2014-0004816 A | 1/2014 |
| WO | 2011/117916 A | 9/2011 |

* cited by examiner

*Primary Examiner* — Jason Berman
(74) *Attorney, Agent, or Firm* — Abelman, Frayne & Schwab

(57) ABSTRACT

A sputtering apparatus includes: a target disposed on a ceiling of a processing container capable of being depressurized; a gas inlet configured to supply a sputtering gas into the processing container; a first shield disposed around the target and configured to prevent deposition of a film around the target; and a second shield disposed in the processing container to cover an inner wall of the ceiling with a space from the ceiling, and including an opening in a portion corresponding to the target.

16 Claims, 4 Drawing Sheets

US 11,149,342 B2

SPUTTERING APPARATUS

CROSS-REFERENCE TO RELATED APPLICATIONS

This application is based on and claims priority from Japanese Patent Application No. 2019-022969 filed on Feb. 12, 2019 with the Japan Patent Office, the disclosure of which is incorporated herein in its entirety by reference.

TECHNICAL FIELD

The present disclosure relates to a sputtering apparatus.

BACKGROUND

A sputtering apparatus has been known in which a sputtering gas is introduced in a vacuum state, a DC voltage is applied between a substrate and a target material to ionize sputtering gas atoms, the gas ions are collided with the surface of the target material at a high speed, and the bounced target material is deposited on the substrate. Various techniques are known in the sputtering apparatus such as a technique that introduces a sputtering gas in the vicinity of a target material (see, e.g., International Publication Pamphlet No. WO 2011/117916), or a technique that introduces a sputtering gas between a cathode and an anode (see, e.g., Japanese Patent Laid-Open Publication No. 2006-505906).

SUMMARY

A sputtering apparatus according to an aspect of the present disclosure includes: a target material disposed on a ceiling of a processing container capable of being depressurized; a gas introducing unit configured to supply a sputtering gas into the processing container; a first shield member disposed around the target material and configured to prevent deposition of a film around the target material; and a second shield member disposed in the processing container to cover an inner wall of the ceiling with a space from the ceiling, and including an opening in a portion corresponding to the target material.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
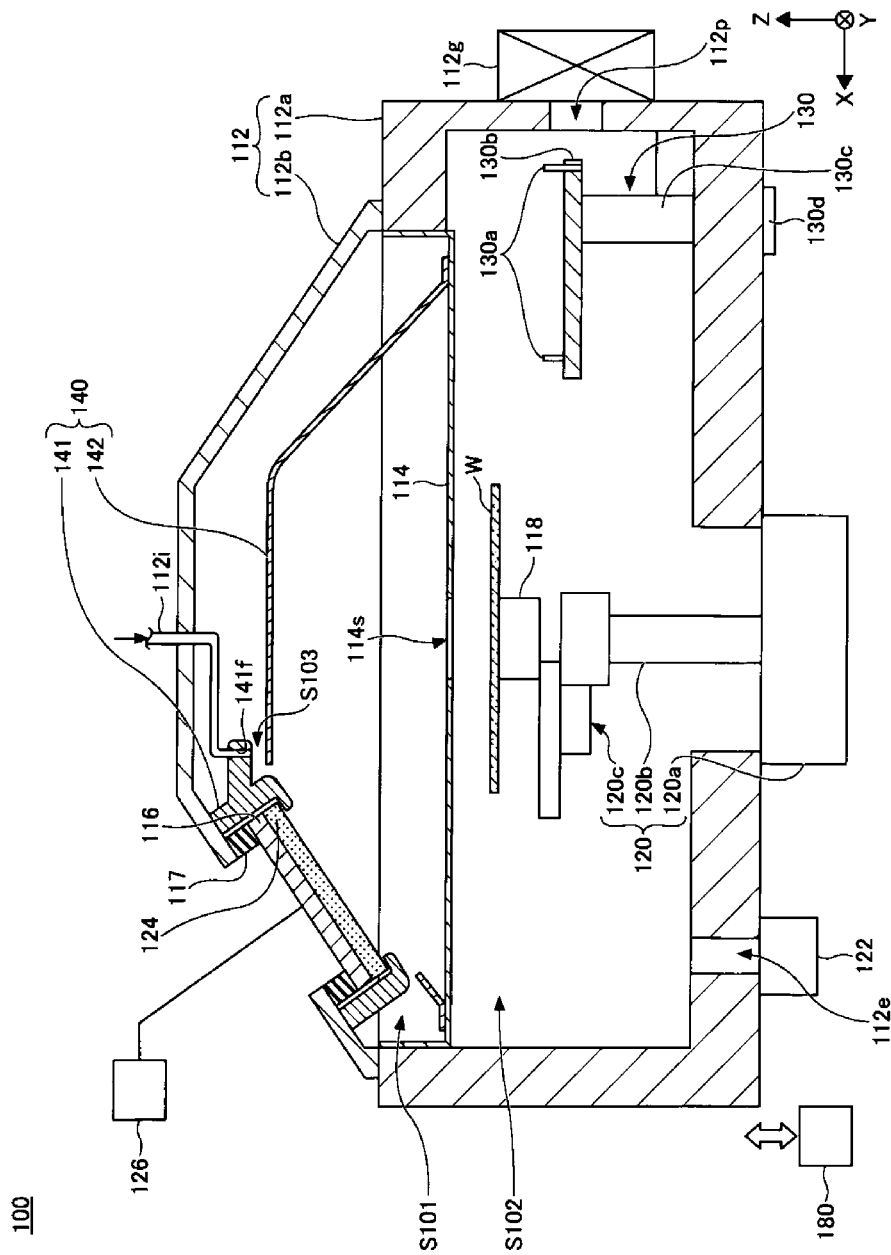
FIG. 1 is a schematic cross-sectional view illustrating a sputtering apparatus according to a first embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

First Embodiment

A sputtering apparatus of a first embodiment will be described with reference to FIG. 1. FIG. 1 is a schematic cross-sectional view illustrating a sputtering apparatus according to a first embodiment.

As illustrated in FIG. 1, a sputtering apparatus 100 is an apparatus in which a target material 124 is disposed to be inclined with respect to a substrate W accommodated in a processing container 112. The sputtering apparatus 100 includes the processing container 112, a slit plate 114, a holder 116, a stage 118, a moving mechanism 120, a substrate lift-up mechanism 130, a shield structure 140, and a controller 180.

The processing container 112 includes a body 112*a* and a lid 112*b*. The body 112*a* has, for example, a substantially cylindrical shape. An upper end of the body 112*a* is opened. The lid 112*b* is detachably provided on the upper end of the body 112*a*, and closes an opening at the upper end of the body 112*a*.

An exhaust port 112*e* is formed at the bottom of the processing container 112. An exhaust device 122 is connected to the exhaust port 112*e*. The exhaust device 122 includes, for example, a pressure controller and a vacuum pump. The vacuum pump may be, for example, a dry pump or a turbo molecular pump.

A transfer port 112*p* is formed at a side wall of the processing container 112. Carrying-in of the substrate W to the processing container 112 and carrying-out of the substrate W from the processing container 112 are performed through the transfer port 112*p*. The transfer port 112*p* is opened/closed by a gate valve 112*g*.

A port 112*i* is provided in the processing container 112 to introduce a sputtering gas into the processing container 112, and, a sputtering gas from a gas supply source (not illustrated) is introduced into the processing container 112 through the port 112*i*. The sputtering gas is a gas for generating plasma, and may be, for example, an inert gas such as Ar gas.

The slit plate 114 is provided inside the processing container 112. The slit plate 114 is a substantially plate-shaped member, and is made of, for example, a metal material such as aluminum or stainless steel. The slit plate 114 extends horizontally at a substantially intermediate position in the height direction of the processing container 112. An edge of the slit plate 114 is fixed at the processing container 112. The slit plate 114 divides the inside of the processing container 112 into a first space S101 and a second space S102. The first space S101 is a space positioned above the slit plate 114. The second space S102 is a space positioned below the slit plate 114. An opening 114*s* is formed in the slit plate 114.

The opening 114*s* penetrates the slit plate 114 in the plate thickness direction (Z direction in the drawings). The slit plate 114 may be formed by one component, or may be formed by a plurality of components. During film formation in the sputtering apparatus 100, the wafer W is moved in the X direction that is one horizontal direction, below the opening 114s. The opening 114s extends long along the Y direction that is the other horizontal direction, and has a substantially rectangular shape in plan view. The Y direction is a longitudinal direction of the opening 114s, and is a direction perpendicular to the X direction. The center of the opening 114s in the Y direction substantially coincides with the center of the substrate W in the Y direction during the film formation. A width of the opening 114s in the Y direction is longer than a width (the maximum width) of the substrate W in the Y direction during the film formation. Meanwhile, a width of the opening 114s in the X direction is set to be shorter than a width (the maximum width) of the substrate W in the X direction during the film formation but is not limited thereto. The width of the opening 114s in the X direction may be set to be longer than the width of the substrate W in the X direction.

The holder 116 is provided above the slit plate 114. The holder 116 is made of a conductive material. The holder 116 is attached to the lid 112b via an insulating member 117. The holder 116 holds the target material 124 disposed in the first space S101. The holder 116 holds the target material 124 such that the target material 124 is positioned obliquely above the opening 114s. In other words, the target material 124 is disposed to be inclined with respect to the slit plate 114 in the processing container 112. The target material 124 has, for example, a rectangular shape in plan view. A width of a projected image obtained by projecting the target material 124 onto the slit plate 114 in the Y direction is larger than the width (the maximum width) of the substrate W in the Y direction during the film formation.

A power supply 126 is connected to the holder 116. When the target material 124 is a metal material, the power supply 126 may be a DC power supply. The power supply 126 may be a radio-frequency power supply when the target material 124 is a dielectric or an insulator, and is connected to the holder 116 via a matching unit.

The stage 118 supports the substrate W in the processing container 112. The stage 118 is attached to the moving mechanism 120, and is configured to be movable. During the film formation, the stage 118 is moved along the moving direction (X direction in FIG. 1) in the second space S102.

The moving mechanism 120 moves the stage 118. The moving mechanism 120 includes a driving device 120a, a driving shaft 120b, and an articulated arm 120c.

The driving device 120a is provided outside the processing container 112. The driving device 120a is attached to, for example, the bottom of the processing container 112. A lower end of the driving shaft 120b is connected to the driving device 120a. The driving shaft 120b penetrates the bottom of the body 112a from the driving device 120a, and extends upward in the processing container 112. The driving device 120a generates a driving force for vertically moving the driving shaft 120b, and also rotating it. The driving device 120a may be, for example, a motor.

One end of the articulated arm 120c is pivotally supported at an upper end of the driving shaft 120b. The other end of the articulated arm 120c is attached to the stage 118. When the driving shaft 120b is rotated by the driving device 120a, the other end of the articulated arm 120c is moved linearly along the X direction. Therefore, the movement of the stage 118 in the second space S102 is implemented. Further, when the driving shaft 120b is vertically moved by the driving device 120a, the articulated arm 120c and the stage 118 are vertically moved.

The substrate lift-up mechanism 130 is provided in an area in the vicinity of the transfer port 112p in the second space S102. The substrate lift-up mechanism 130 includes a plurality of lift pins 130a, a support member 130b, a driving shaft 130c, and a driving device 130d. The plurality of lift pins 130a has a cylindrical shape extending in the vertical direction. Heights of upper ends of each of the plurality of lift pins 130a in the vertical direction are substantially the same with each other. The number of the plurality of lift pins 130a may be, for example, three. The plurality of lift pins 130a are supported by the support member 130b. The support member 130b has a substantially horseshoe shape. The plurality of lift pins 130a extend above the support member 130b. The support member 130b is supported by the driving shaft 130c. The driving shaft 130c extends below the support member 130b, and is connected to the driving device 130d. The driving device 130d generates a driving force for vertically moving the plurality of lift pins 130a. The driving device 130d may be, for example, a motor.

When the substrate W is transferred into the processing container 112 by a transfer device (not illustrated) from the outside of the processing container 112, and before mounting the substrate W on the stage 118, the substrate lift up mechanism 130 receives the substrate W on the upper end of each of the plurality of lift pins 130a from the transfer device. Further, when the substrate W is carried out to the outside of the processing container 112, the substrate lift up mechanism 130 receives the substrate W on the upper end of each of the plurality of lift pins 130a from the stage 118.

Figure 2:
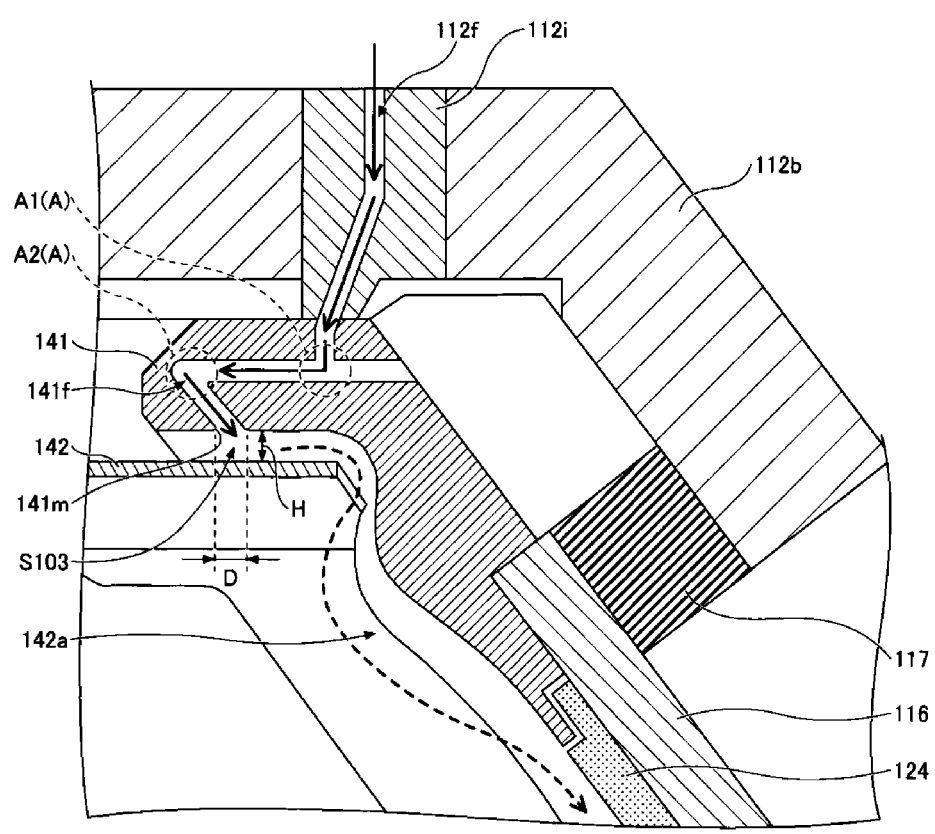
FIG. 2 is an enlarged cross-sectional view illustrating a gas introducing unit of the sputtering apparatus in FIG. 1.
Figure 3:
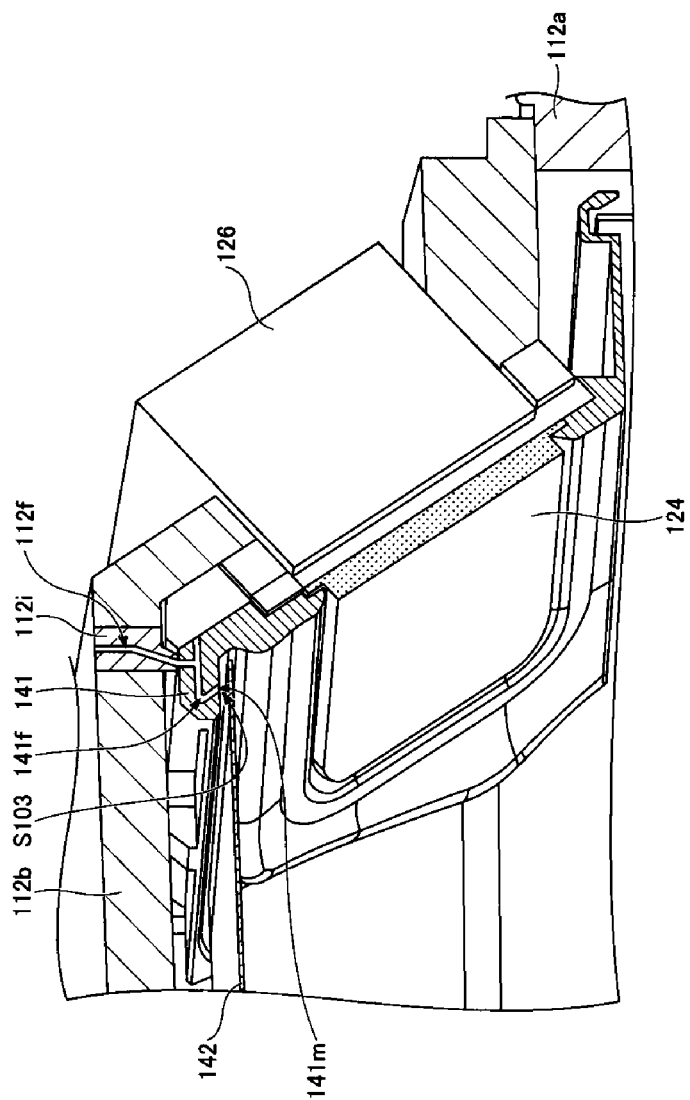
FIG. 3 is an enlarged perspective cross-sectional view illustrating the gas introducing unit of the sputtering apparatus in FIG. 1.

The shield structure 140 suppresses deposition of a film on the lid 112b of the processing container 112. FIG. 2 is an enlarged cross-sectional view illustrating a gas introducing unit of the sputtering apparatus 100 in FIG. 1. FIG. 3 is an enlarged perspective cross-sectional view illustrating the gas introducing unit of the sputtering apparatus 100 in FIG. 1. As illustrated in FIGS. 1 to 3, the shield structure 140 includes a first shield member 141 and a second shield member 142.

The first shield member 141 is an adhesion preventing plate that is disposed around the target material 124, and prevents deposition of a film around the target material 124. The first shield member 141 is attached to, for example, the lid 112b. The first shield member 141 includes a gas flow path 141f therein.

One end of the gas flow path 141f communicates with a flow path 112f in the port 112i formed in the lid 112b. The other end of the gas flow path 141f communicates with a space S103 between the first shield member 141 and the second shield member 142, and functions as a discharge port 141m configured to discharge the sputtering gas to the space S103. Therefore, the sputtering gas supplied to the flow path 112f in the port 112i from the gas supply source is discharged from the discharge port 141m to the space S103 through the gas flow path 141f formed in the first shield member 141. The flow of the sputtering gas is indicated by arrows in FIG. 2.

The discharge port 141m is disposed at a position that becomes a blind spot of a target substance released from the target material 124. In an example illustrated in FIG. 2, the discharge port 141m is disposed at a position hidden by the second shield member 142 when viewed from the target material 124. Therefore, the target substance released from the target material 124 may be suppressed from being deposited in the gas flow path 141f. As a result, it is possible to suppress generation of particles due to film peeling. In this regard, when the target substance is deposited in the gas flow path 141f, the film deposited in the gas flow path 141f may be peeled off by the sputtering gas flowing through the gas flow path 141f, and particles may be generated.

The gas flow path 141f may include, for example, one or a plurality of bent portions A. In the example illustrated in FIG. 2, the gas flow path 141f includes two bent portions A1 and A2. The bent portion A1 is a bent portion that is bent vertically from the vertical direction to the horizontal direction, and the bent portion A2 is a bent portion that is bent at an acute angle obliquely downward from the horizontal direction toward the target material 124 side.

The side on which the discharge port 141m of the gas flow path 141f is formed is inclined in the direction of the target material 124 with respect to the vertical direction. Therefore, the sputtering gas discharged from the discharge port 141m is discharged in the direction of the target material 124 with respect to the vertical direction, thereby forming a flow toward the target material 124. Therefore, it is possible to efficiently supply the sputtering gas to the vicinity of the target material 124.

A diameter D of an opening of the discharge port 141m of the gas flow path 141f may be smaller than a height H of the space S103 between the first shield member 141 and the second shield member 142. Therefore, a flow velocity of the sputtering gas discharged from the discharge port 141m becomes low by passing through the space S103, and thus, stay of the sputtering gas in the vicinity of the target material 124 is promoted. As a result, it is possible to reduce the consumption amount of the sputtering gas. Further, it is possible to suppress the film deposited on the first shield member 141 or the second shield member 142 from being peeled off.

The second shield member 142 is disposed in the processing container 112 to cover an inner wall of the lid 112b with a space from the lid 112b, and includes an opening 142a in a portion corresponding to the target material 124.

The controller 180 controls an operation of each component of the sputtering apparatus 100. The controller 180 includes a central processing unit (CPU), a read only memory (ROM), and a random access memory (RAM). The CPU executes a desired processing according to a recipe stored in a memory area such as the RAM. Control information of the apparatus with respect to the process condition is set in the recipe. The control information may be, for example, gas flow rate, pressure, temperature, and process time. The recipe and a program used by the controller 180 may be stored in, for example, a hard disk or a semiconductor memory. The recipe or the like may be set at a predetermined position and read out in a state of being stored in a storage medium readable by a portable computer such as a CD-ROM or a DVD.

As described above, the first embodiment includes the first shield member 141 and the second shield member 142. Then, the first shield member 141 is disposed around the target material 124 disposed on the lid 112b of the processing container 112, and prevents the deposition of the film around the target material 124. Further, the second shield member 142 is disposed in the processing container 112 to cover the lid 112b with a space from the lid 112b, and includes the opening 142a in the portion corresponding to the target material 124. Therefore, it is possible to suppress the deposition of the film on the inner wall of the processing container 112.

Second Embodiment

Figure 4:
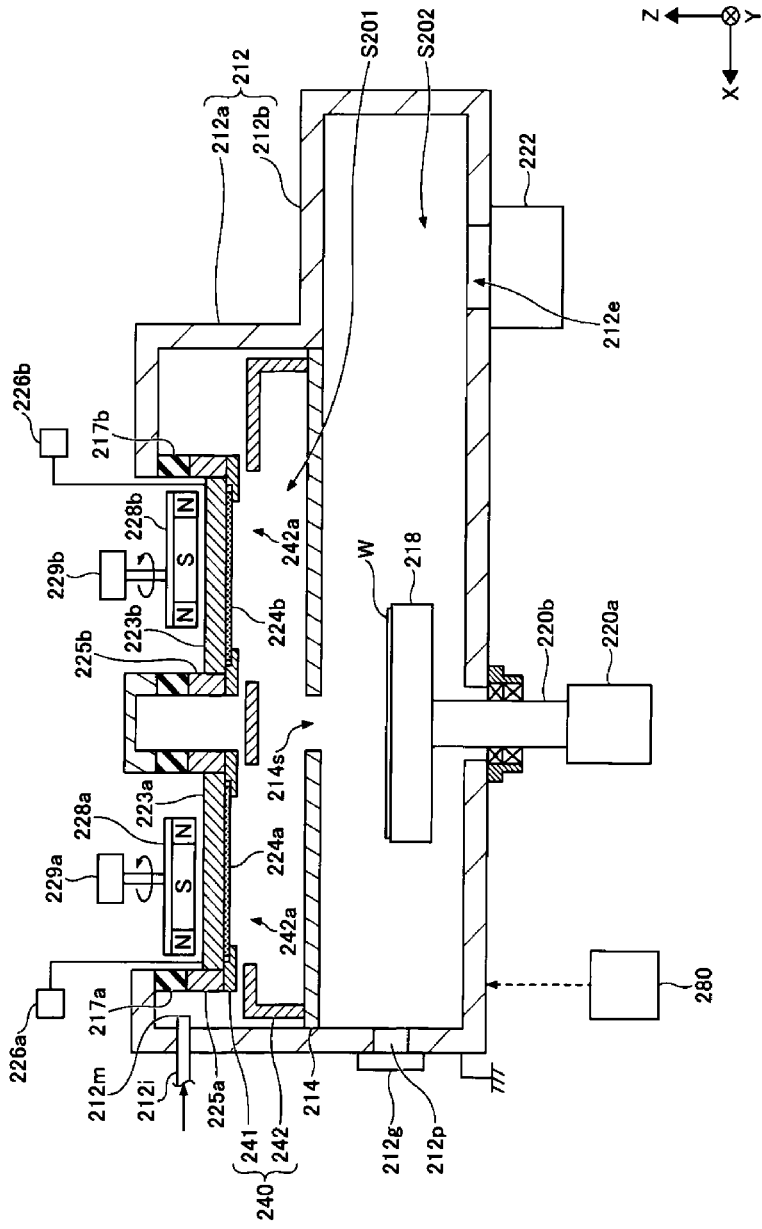
FIG. 4 is a schematic cross-sectional view illustrating a sputtering apparatus according to a second embodiment.

A sputtering apparatus of a second embodiment will be described with reference to FIG. 4. FIG. 4 is a schematic cross-sectional view illustrating the sputtering apparatus according to the second embodiment.

As illustrated in FIG. 4, a sputtering apparatus 200 is an apparatus in which the target materials 224a and 224b are disposed in parallel with the substrate W accommodated in a processing container 212.

The sputtering apparatus 200 includes the processing container 212 and the inside thereof may be depressurized. The processing container 212 is made of, for example, a metal material, and is grounded. The processing container 212 includes a cylindrical portion 212a and a protruding portion 212b. On a ceiling of the cylindrical portion 212a, target electrodes 223a and 223b, which are both circular and have substantially the same size, are horizontally provided side by side in the left and right direction (X direction). The target electrodes 223a and 223b are joined to ring-shaped insulators 217a and 217b through ring-shaped holding bodies 225a and 225b, respectively. The insulators 217a and 217b are joined to a ceiling of the processing container 212. Therefore, the target electrodes 223a and 223b are disposed at a position that is sunk lower than an upper surface of the cylindrical portion 212a in a state of being electrically insulated from the processing container 212.

Target materials 224a and 224b are joined to a lower surface of the target electrodes 223a and 223b, respectively. The shape of the target materials 224a and 224b is, for example, rectangular, and the size thereof is substantially the same.

The target electrodes 223a and 223b are connected to power supplies 226a and 226b, respectively, and for example, are configured such that a negative DC voltage is applied thereto.

A stage 218 on which the substrate W is horizontally placed is provided in the processing container 212, so as to face the target materials 224a and 224b. The stage 218 is connected to a driving device 220a disposed below the processing container 212 through a driving shaft 220b. The driving device 220a has a function of rotating the state 218, and moving the substrate W up and down between a position where the substrate W is transferred to and from an external transfer mechanism (not illustrated) and a processing position during the sputtering. Further, a heating mechanism (not illustrated) is provided in the stage 218, and is configured to heat the substrate W during the sputtering.

Magnet arrays 228a and 228b are provided above the target electrodes 223a and 223b so as to be close to the target electrodes 223a and 223b, respectively. The magnet arrays 228a and 228b are constituted by arranging an N-pole magnet group and an S-pole magnet group on a highly magnetically permeable material (e.g., an iron (Fe) base body) such that the N-pole and the S-pole are arranged in a matrix form.

The magnet arrays 228a and 228b are disposed at a position eccentrical from the center in order to enhance the uniformity of erosion of the target materials 224a and 224b. The magnet arrays 228a and 228b are rotated about the center of the target materials 224a and 224b as the center of rotation by rotating mechanisms 229a and 229b.

Further, a slit plate 214 is provided in the processing container 212, in order to prevent a target substance released from the target materials 224a and 224b from being adhered to the substrate W.

The slit plate 214 is provided below the target materials 224a and 224b in the processing container 212. The slit plate 214 is a substantially plate-shaped member, and is made of, for example, a metal material such as aluminum or stainless steel. The slit plate 214 extends horizontally at a substantially intermediate position in the height direction of the processing container 212. An edge of the slit plate 214 is fixed at the processing container 212. The slit plate 214 divides the inside of the processing container 212 into a first space S201 and a second space S202. The first space S201 is a space positioned above the slit plate 214. The second space S202 is a space positioned below the slit plate 214. An opening 214s is formed in the slit plate 214.

The opening 214s penetrates the slit plate 214 in the plate thickness direction (Z direction in the drawings). The slit plate 214 may be formed by one component, or may be formed by a plurality of components. During the film formation in the sputtering apparatus 200, the wafer W is moved in the X direction that is one horizontal direction, below the opening 214s. The opening 214s extends long along the Y direction that is the other horizontal direction, and has a substantially rectangular shape in plan view. The Y direction is a longitudinal direction of the opening 214s, and is a direction perpendicular to the X direction. The center of the opening 214s in the Y direction substantially coincides with the center of the substrate W in the Y direction during the film formation. A width of the opening 214s in the Y direction is longer than a width (the maximum width) of the substrate W in the Y direction during the film formation. Meanwhile, a width of the opening 214s in the X direction is set to be shorter than a width (the maximum width) of the substrate W in the X direction during the film formation but is not limited thereto. The width of the opening 114s in the X direction may be set to be longer than the width of the substrate W in the X direction.

An exhaust port 212e is formed at the bottom of the processing container 212. An exhaust device 222 is connected to the exhaust port 212e. The exhaust device 222 includes, for example, a pressure controller and a vacuum pump. The vacuum pump may be, for example, a dry pump or a turbo molecular pump.

A transfer port 212p is formed at a side wall of the processing container 212. Carrying-in of the substrate W to the processing container 212 and carrying-out of the substrate W from the processing container 212 are performed through the transfer port 212p. The transfer port 212p is opened/closed by a gate valve 212g.

A port 212i is provided on an upper side wall of the processing container 212 to introduce a sputtering gas into the processing container 212, and a sputtering gas from a gas supply source is introduced into the processing container 212 through the port 212i. The sputtering gas is a gas for generating plasma, and may be, for example, an inert gas such as Ar gas.

Further, a shield structure 240 that suppresses deposition of a film on the cylindrical portion 212a of the processing container 212 is provided in the processing container 212. The shield structure 240 includes a first shield member 241 and a second shield member 242.

The first shield member 241 is an adhesion preventing plate that is disposed around the target materials 224a and 224b, and prevents deposition of a film around the target materials 224a and 224b. The first shield member 241 is attached to, for example, the holding bodies 225a and 225b.

The second shield member 242 is disposed in the processing container 212 to cover an inner wall of the cylindrical portion 212a with a space from the cylindrical portion 212a, and includes openings 242a in portions corresponding to the target materials 224a and 224b.

In the sputtering apparatus 200, a discharge port 212m of the port 212i on the processing container 212 side is disposed at a position that becomes a blind spot of the target substance released from the target materials 224a and 224b. In an example illustrated in FIG. 4, the discharge port 212m is disposed to be hidden by the holding body 225a, the first shield member 241 and the like when viewed from the target materials 224a and 224b. Therefore, the target substance released from the target materials 224a and 224b may be suppressed from being deposited in the port 212i. As a result, it is possible to suppress generation of particles due to film peeling. In this regard, when the target substance is deposited in the port 212i, the film deposited in the port 212i may be peeled off by the sputtering gas flowing through the port 212i, and particles may be generated.

The controller 280 controls an operation of each component of the sputtering apparatus 200. The controller 280 includes a central processing unit (CPU), a read only memory (ROM), and a random access memory (RAM). The CPU executes a desired processing according to a recipe stored in a memory area such as the RAM. Control information of the apparatus with respect to the process condition is set in the recipe. The control information may be, for example, gas flow rate, pressure, temperature, and process time. The recipe and a program used by the controller 280 may be stored in, for example, a hard disk or a semiconductor memory. The recipe or the like may be set at a predetermined position and read out in a state of being stored in a storage medium readable by a portable computer such as a CD-ROM or a DVD.

As described above, the sputtering apparatus 200 according to the second embodiment includes the first shield member 241 and the second shield member 242. Then, the first shield member 241 is disposed around the target materials 224a and 224b disposed in the cylindrical portion 212a of the processing container 212, and prevents the deposition of the film around the target materials 224a and 224b. Further, the second shield member 242 is disposed in the processing container 212 to cover the cylindrical portion 212a with a space from the cylindrical portion 212a, and includes the opening 242a in a portion corresponding to the target materials 224a and 224b. Therefore, it is possible to suppress the deposition of the film on the inner wall of the processing container 212.

In the embodiments described above, the ports 112i and 212i and the gas flow path 141f are examples of a gas introducing unit. Further, the lid 112b and the cylindrical portion 212a are an example of a ceiling.

According to the present disclosure, it is possible to suppress deposition of a film on an inner wall of a processing container.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A sputtering apparatus comprising:
a target disposed on a ceiling of a processing container capable of being depressurized;
a gas inlet configured to supply a sputtering gas into the processing container;
a first shield disposed around the target and configured to prevent deposition of a film around the target; and
a second shield disposed in the processing container to cover an inner wall of the ceiling with a space from the ceiling and including an opening in a portion corresponding to the target, wherein the gas inlet includes a gas flow path formed inside the first shield, and the gas flow path includes one or a plurality of bent portions at least one of which is bent at an acute angle.

2. The sputtering apparatus according to claim 1, wherein the gas inlet includes a discharge port disposed at a position that becomes a blind spot of a target substance released from the target.

3. The sputtering apparatus according to claim 2, wherein the discharge port of the gas inlet is disposed at a position hidden by the second shield when viewed from the target.

4. The sputtering apparatus according to claim 3, wherein the gas inlet introduces the sputtering gas in a direction inclined to a direction of the target with respect to a vertical direction.

5. The sputtering apparatus according to claim 4, wherein the gas inlet communicates with a space formed by the first shield and the second shield through the discharge port.

6. The sputtering apparatus according to claim 5, wherein a diameter of the opening of the discharge port is smaller than a height of the space.

7. The sputtering apparatus according to claim 6, wherein the processing container includes a body and a lid detachably attached to the body, the first shield is provided on the lid, and the second shield is provided on the body.

8. The sputtering apparatus according to claim 7, wherein the target is disposed to be inclined with respect to a substrate accommodated in the processing container.

9. The sputtering apparatus according to claim 7, wherein the target is disposed in parallel with a substrate accommodated in the processing container.

10. The sputtering apparatus according to claim 2, wherein the gas inlet introduces the sputtering gas in a direction inclined in a direction of the target with respect to a vertical direction.

11. The sputtering apparatus according to claim 2, wherein the gas inlet communicates with a space formed by the first shield and the second shield through the discharge port.

12. The sputtering apparatus according to claim 11, wherein a diameter of the opening of the discharge port is smaller than a height of the space.

13. The sputtering apparatus according to claim 1, wherein the processing container includes a body and a lid detachably attached to the body, the first shield is provided on the lid, and the second shield is provided on the body.

14. The sputtering apparatus according to claim 1, wherein the target is disposed to be inclined with respect to a substrate accommodated in the processing container.

15. The sputtering apparatus according to claim 1, wherein the target is disposed in parallel with a substrate accommodated in the processing container.

16. A sputtering apparatus comprising:

a target disposed on a ceiling of a processing container capable of being depressurized;

a first shield disposed around the target and configured to prevent deposition of a film around the target;

a second shield disposed in the processing container to cover an inner wall of the ceiling with a space from the ceiling and including an opening in a portion corresponding to the target; and a gas inlet configured to supply a sputtering gas into the processing container and including a discharge port facing the second shield, wherein the gas inlet introduces the sputtering gas toward the target in an inclined direction with respect to a perpendicular direction of a surface of the second shield facing the discharge port.

* * * * *